United States Patent

[11] 3,603,892

[72] Inventors T. O. Paine
Administrator of the National Aeronautics and Space Administration with respect to an invention of;
John E. Guisinger, Los Angeles; George W. Lewicki, Los Angeles, Calif.

[21] Appl. No. 865,274
[22] Filed Oct. 10, 1969
[45] Patented Sept. 7, 1971

[54] HIGH VOLTAGE TRANSISTOR AMPLIFIER WITH CONSTANT CURRENT LOAD
2 Claims, 3 Drawing Figs.

[52] U.S. Cl. .......... 330/18, 330/40
[51] Int. Cl. .......... H03f 3/42
[50] Field of Search .......... 330/18, 40, 70

[56] References Cited

UNITED STATES PATENTS

| | | | |
|---|---|---|---|
| 2,845,574 | 7/1958 | Shapiro | 330/70 X |
| 3,024,422 | 3/1962 | Jansson | 330/18 |
| 3,339,147 | 8/1967 | Collins et al. | 330/18 UX |
| 3,451,001 | 6/1969 | Foerster | 330/18 X |
| 3,487,322 | 12/1969 | Ludlum | 330/18 UX |

FOREIGN PATENTS

| | | | |
|---|---|---|---|
| 981,639 | 1/1965 | Great Britain | 330/18 |

*Primary Examiner*—Roy Lake
*Assistant Examiner*—James B. Mullins
*Attorneys*—J. H. Warden, Paul F. McCaul and G. T. McCoy

ABSTRACT: An amplifying circuit is disclosed wherein a constant current source is used as the cpllector load for an output amplifying transistor to provide high gain voltage amplification. The amplifying circuit has an high output impedance operable from a high DC supply voltage. The constant current source in one embodiment comprises a plurality of cascade connected transistors, having their base bias' fixedly determined by either diodes or voltage cells. The number of cascade connected transistors may be varied to accommodate any supply voltage level while insuring that each load transistor operates below its avalanche breakdown range.

INVENTORS
JOHN E GUISINGER
GEORGE W LEWICKI

BY

Paul F McCaul
John C Coy

ATTORNEYS

INVENTORS.
JOHN E. GUISINGER
GEORGE W. LEWICKI
BY
Paul F. McCaul
ATTORNEYS.

INVENTORS
JOHN E. GUISINGER
GEORGE W. LEWICKI

BY Paul F. McCaul
A. Tom McCoy
ATTORNEYS

HIGH VOLTAGE TRANSISTOR AMPLIFIER WITH CONSTANT CURRENT LOAD

ORIGIN OF THE INVENTION

The invention described herein was made in the performance of work under an NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

The present invention relates to transistor amplifiers and more particularly to high-gain amplifying devices operable from a high DC voltage supply.

2. Description of the Prior Art

There is a requirement in certain applications for a high gain transistor amplifier to deliver a high output voltage at relatively low-power levels. A known technique for obtaining high voltage gain in a transistor amplifier circuit is to utilize a high load resistance in the collector circuit of the output amplifying transistor. In effect, the high collector load resistance operates in conjunction with the supply voltage to provide a quasi-constant collector load current to the output transistor.

A known approach to providing a high amplifier output voltage has been to use a very high collector load resistance in conjunction with a very high supply voltage. Such a configuration is disadvantageous since the use of very high supply voltages, even in association with a high load resistance, can cause a transistor to go into secondary breakdown avalanche. Further, the load resistance and supply voltage values required to obtain adequate supply current constancy for high gain operation are impracticably high for many applictions.

Another prior art approach has been to attempt to provide a constant collector current supply by utilizing a transistor as a constant current source in the collector load circuit of the output amplifying transistor. A resistive voltage divider connected to the supply voltage is used to attempt to bias the base terminal of the collector load transistor at a fixed level.

Prior art transistor collector load configurations, however, are limited in the constancy of the current they can supply. The major limitation results from the fact that the resistive base bias circuits experience voltage fluctuations during circuit operation which varies the base bias on the collector load transistor and thus significantly degrades the constancy of the current supplied. Further, prior transistorized collector load circuits restrict the range of supply voltages feasible since operation with very high supply voltages causes avalanche breakdown of the collector load transistor totally destroying its current regulating ability.

OBJECTS AND SUMMARY OF THE INVENTION

The amplifying circuit of the present invention utilizes a unique transistor current source configuration connected as a load in the collector circuit of an output amplifying transistor. The collector load transistor configuration provides a highly stabilized constant current source operable from any desired supply voltage level.

In a first embodiment, the transistor current source configuration comprises a cascade connected transistor string. The base bias for the transistors of the cascade transistor string is provided via a zener diode-resistor string configuration connected to the supply voltage effectively in parallel with the transistor string. The stable voltage drop of each zener diode provides a highly stabilized base bias for each associated transistor of the collector load cascade transistor string. The collector load transistor string thus provides any desired predetermined constant current depending only on the zener diode voltage drops and the value of the emitter resistor provided for each associated collector load transistor. The stable current supply thus obtained supplies constant current to the collector of the output amplifying transistor.

Any supply voltage level may be accommodated by simply varying the number of transistors in the collector load cascade transistor string, each load transistor seeing only its proportional share of the supply voltage. The constant current source connected in the collector circuit of the output transistor operates as an extremely high effective collector load impedance, which allows the amplifying circuit to approach the maximum theoretical voltage gain from the amplifier output transistor.

In a second embodiment, the base bias for the cascade transistor string is provided by a plurality of voltage cells, one each connected in an electrically isolated base bias circuit of each of the collector load transistors. Means are provided to connect the bias voltage cells only when the amplifying circuit is in operation thus reducing the power drawn from the cells during periods of circuit nonoperation. Use of bias voltage cells enables accurate control of the collector load transistors without requiring any parallel connected resistance in the output collector load circuit, thus assuring optimum constant current performance.

In a third embodiment, the collector load constant current source comprises a single collector load transistor. A zener diode in series with a resistor is connected between the supply voltage and a second reference potential. The stable voltage drop of the zener diode provides the base bias for the collector load transistor. The collector load transistor provides any desired predetermined constant current depending on the zener diode voltage drop and the value of the emitter resistor provided for the collector load transistor.

It is, therefore, an object of this invention to provide a transistor amplifier capable of delivering a high voltage at relatively low-power levels.

It is another object of the present invention to provide a novel collector load for the output transistor of a transistor amplifier.

It is a further object of the present invention to provide a novel constant current source as an output amplifying transistor collector load in a transistor amplifier to provide a high output voltage amplifying device with a high output impedance operable from a high DC voltage supply.

Still other objects, features and attendant advantages of the present invention will become apparent to those skilled in the art from a reading of the following detailed description of several embodiments constructed in accordance therewith taken in conjunction with the accompanying drawings and wherein:

DESCRIPTION OF THE PREFERRED EMBODIMENT

Figure 1:
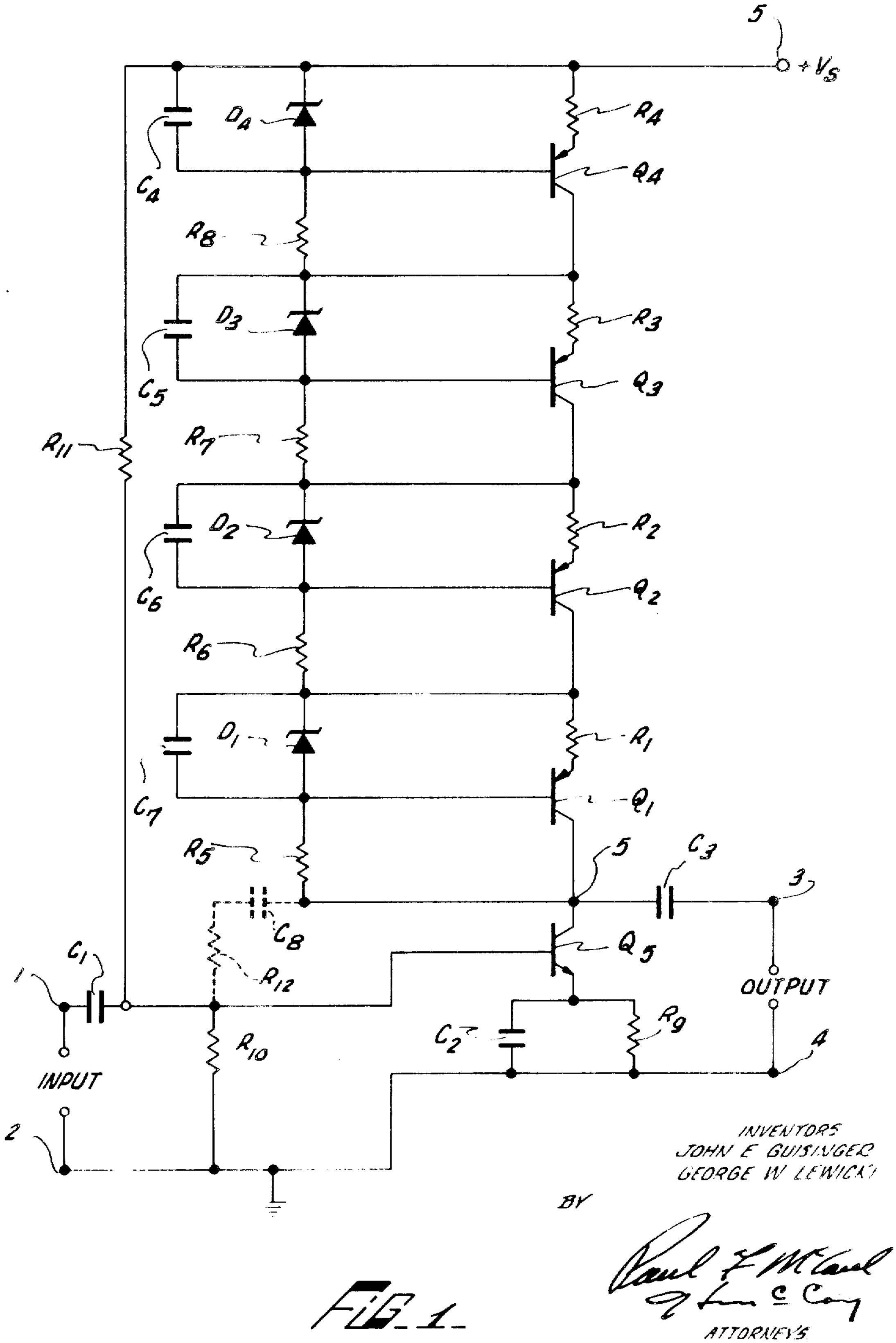
FIG. 1 is a schematic diagram of one embodiment of an amplifier constructed in accordance with the principles of the present invention.

Referring now to FIG. 1, there is shown an exemplary amplifier circuit constructed in accordance with the principles of the present invention.

Shown in FIG. 1 is a transistor amplifier having input terminals 1 and 2 and output terminals 3 and 4. The exemplary amplifier comprises an NPN transistor $Q_5$ connected in a common emitter configuration. The amplifier is fed from a relatively high supply voltage $V_s$. $V_s$ may typically be on the order of 300 volts or more in accordance with this invention.

The DC operating point is set in a conventional manner by potentiometer resistors $R_{10}$ and $R_{11}$, connected between the supply voltage and ground. Resistor $R_9$ is connected between the emitter of output transistor $Q_5$ and ground and also assists in establishing the DC operating point.

To avoid loss of an AC input signal across the emitter resistor $R_9$, the latter is shunted by capacitor $C_2$ so that the AC signal appears directly across the base and emitter terminals. The AC signal is fed into the base and out through the collector through capacitors $C_1$ and $C_3$ respectively so that the DC bias conditions are not affected by the signal circuit.

The resistor $R_{12}$ and capacitor $C_8$ shown dashed between the collector and base of output amplifying transistor $Q_5$ may be utilized if inverse feedback is desired. As is well known, the overall gain of the amplifier will be less with such feedback.

In accordance with this invention, the collector load consists of a plurality of transistors $Q_1$, $Q_2$, $Q_3$and $Q_4$ connected in series cascade configuration from the collector of output transistor $Q_5$ to the voltage supply $V_s$ as shown. As will be hereinafter described, the collector load cascade transistor configuration acts as a constant current supply to the collector of the output amplifying transistor $Q_5$.

As shown, the emitter terminal of collector load transistor $Q_4$ is connected to the voltage supply $V_s$ via emitter bias resistor $R_4$. The base bias voltage for transistor $Q_4$ is provided by a zener diode $D_4$. A zener diode, as is well known, will maintain a constant voltage drop across its terminals if sufficient current is applied therethrough. The voltage drop across zener diode $D_4$ sets the current level through the transistor $Q_4$ in a well-known manner; that is, the emitter current passing through bias resistor $R_4$ must be sufficient to provide a voltage drop equal to the zener diode voltage less whatever base emitter voltage drop there may be.

A resistor $R_8$ of relatively large value is connected between the base and collector of transistor $Q_4$, as shown. The $D_4$ and $R_8$ diode-resistor combination assures that transistor $Q_4$ will see its proportionate voltage from voltage supply $V_s$ as will be explained in more detail hereinafter. The remaining collector load transistors $Q_1$, $Q_2$ and $Q_3$, are similarly supplied with associated emitter bias resistors $R_1$, $R_2$ and $R_3$ respectively, associated base bias diodes $D_1$, $D_2$ and $D_3$ respectively, and associated base bias resistors $R_5$, $R_6$ and $R_7$ respectively. Each diode $D_1$–$D_4$ is shunted by an associated capacitor $C_4$–$C_7$ respectively to prevent variation of the base bias due to an AC input signal.

As can be seen, the base bias resistors $R_5$–$R_8$ are in series electrical relationship with the zener diodes $D_1$–$D_4$ which together provide a circuit path parallel to the collector load transistor string from the voltage supply $V_s$ to the collector terminal 5 of output transistor $Q_5$. Since any current variation through the resistor diode string path will degrade the constancy of the output transistor collector current supply, the base bias resistors $R_5$–$R_8$ are preferably chosen to be as large as practicable limited only by the minimum current required by the zener diodes $D_1$–$D_4$. The base bias resistors $R_5$–$R_8$, which are all preferably of equal value, assure that each transistor of the collector string $Q_1$–$Q_4$ will see its proportionate share of the supply voltage and no more.

The emitter bias resistors $R_1$–$R_4$ are also preferably of equal value and are chosen to provide the desired collector supply current for the output transistor $Q_5$.

The collector load transistor string configuration allows the amplifier to be driven from any desired high supply voltage ($V_s$) without having any one collector supply transistor experience a voltage in excess of its breakdown characteristic. The cascade arrangements of supply transistors and associated biasing components is readily modifiable to handle supply voltage levels of any desired magnitude. This is accomplished by merely adding or subtracting transistor stages to the cascade transistor string to the point where each transistor will be assured of only seeing a tolerable voltage thereacross.

In the operation of the circuit thus described, incoming signals of a negative polarity cause the base terminal of output transistor $Q_5$ to go negative with respect to its quiescent point. Transistor $Q_5$ will therefore attempt to draw less current. However, since the collector of transistor $Q_5$ is supplied with a constant current, the output transistor must conduct the collector current which is being supplied. Accordingly, the collector terminal of the output transistor will go positive with respect to its quiescent point.

Incoming signals of a positive polarity cause the base of output transistor $Q_5$ to go positive. As the potential at the base of transistor $Q_5$ goes positive, the transistor $Q_5$ attempts to conduct additional current. However, since the current supplied to the collector of transistor $Q_5$is constant, the overall current through the transistor cannot change. Therefore, the collector terminal will go negative with respect to its quiescent point to accommodate the base potential-collector current values.

The constant current supply cascade transistor string represents the collector load of the output transistor $Q_5$. As such, it represents an extremely high impedance, allowing he amplifying circuit to approach the maximum theoretical gain of the output transistor.

The output voltage seen across terminals thus and 4, by this technique negative be made to vary from zero to the supply voltage level $V_s$ which, in accordance with the present invention, may be of extremely high value. There is thus described a single stage amplifying circuit providing a higher voltage gain than is achievable by any other known practicable single stage amplifying circuit.

Figure 2:
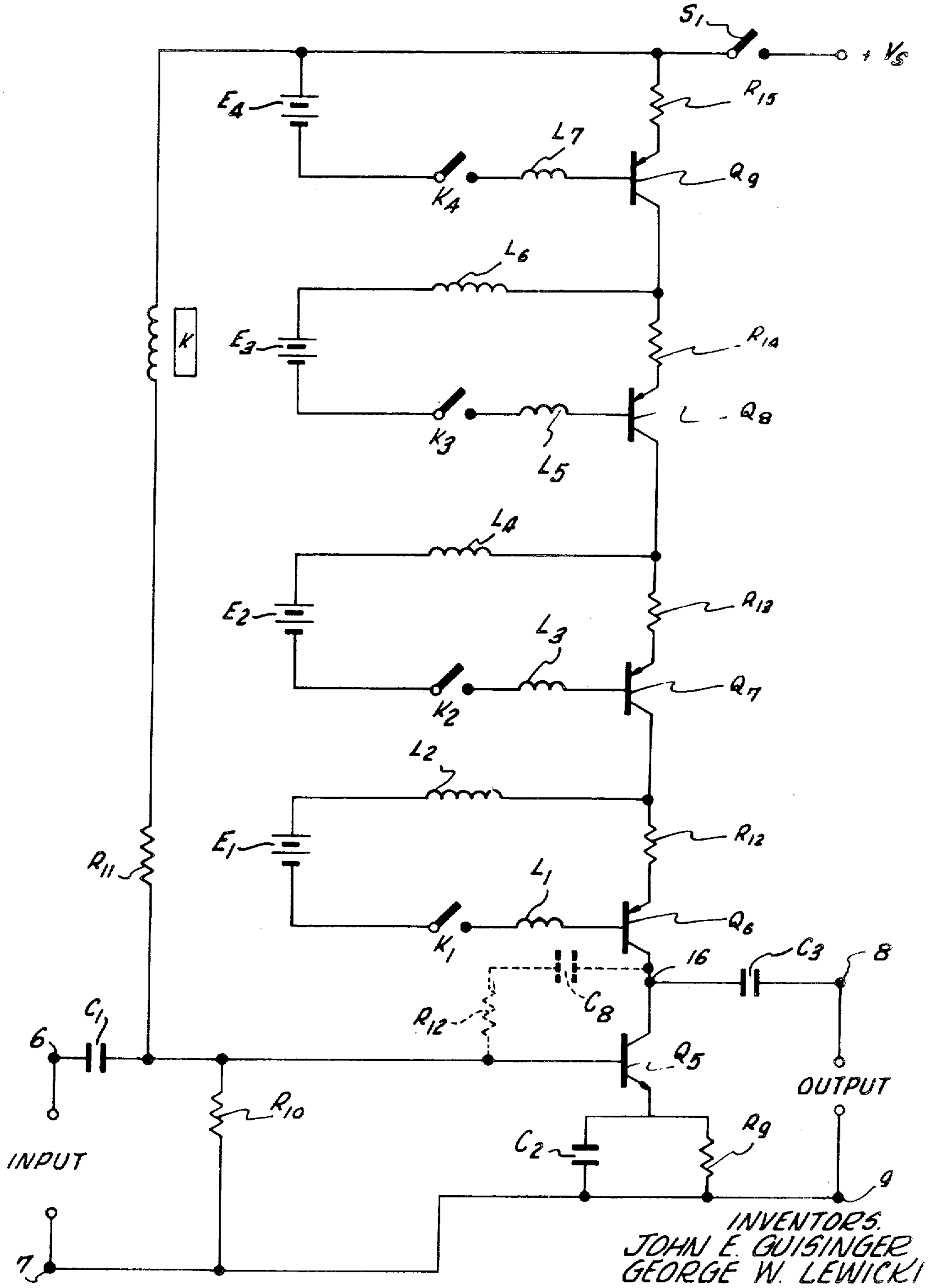
FIG. 2 is a schematic diagram of a second embodiment of an amplifier constructed in accordance with the principles of the present invention.

Referring now to FIG. 2, there is shown a second embodiment of a transistor amplifier constructed in accordance with the principles of the present invention.

Shown in FIG. 2 is an amplifier having a DC bias circuit similar to that of the embodiment of FIG. 1. The collector load for the output transistor $Q_5$ of FIG. 2 is provided by the cascade connected transistor string comprising transistors $Q_6$–$Q_{9a}$.

The embodiment of FIG. 2 differs from that in FIG. 1 in that the base bias for the collector load cascade connected transistors is provided by a plurality of bias cells $E_1$–$E_4$ connected respectively in the base bias circuit of the collector load transistors $Q_6$–$Q_9$. The bias cells may preferably be mercury cell batteries selected of proper value in conjunction with the emitter bias resistors $R_{12}$–$R_{15}$ to provide the output amplifying transistor ($Q_5$) with a preselected collector load current level.

Since it is desired to only draw power from the mercury cell batteries when the circuit is in actual operation, a plurality of switch contact $K_1$–$K_4$ are connected in the base bias circuits of the collector load transistor string. The contacts are operated from a relay K which is connected in series electrical relationship with the DC bias resistor $R_{11}$.

A switch $S_1$ connected in series relationship with the voltage supply $V_s$ is used to turn the amplifying circuit on. The relay K senses the bias current and upon operating closes the contacts $K_1$–$K_4$ thus energizing the base bias circuits of the collector transistor string.

A plurality of inductive chokes $L_1$–$L_7$ are connected in the collector load transistor string base bias circuits, as shown. The chokes $L_1$–$L_7$isolate the bias circuits from the AC information signal components. The collector load transistor string of FIG. 2 provides a constant collector load current to the output amplifying transistor $Q_5$.

The embodiment of FIG. 2, unlike that of FIG. 1, does not require a resistor-diode string in parallel electrical connection to the output transistor collector supply cascade transistor string. The embodiment of FIG. 2 is therefore adapted to deliver a more constant current to the collector of the amplifying transistor $Q_5$ than the embodiment of FIG. 1 since as previously mentioned the presence of a parallel electrical path is degrading to the constancy of the current supplied. The embodiment of FIG. 2, however, requires the use of bias cells whereas that of FIG. 1 may be operated entirely from the supply voltage. The amplifying operation of the embodiment of FIG. 2 is similar to that of FIG. 1 and need not be repeated.

The values of bias cells $E_1$–$E_4$ and the emitter bias resistors $R_{12}$–$R_{15}$ are chosen to assure that each of the collector load transistors $Q_6$–$Q_9$ sees only its proper share of supply voltage. By this technique a supply voltage of any level may be accommodated by simply increasing or decreasing the number of collector load transistors.

Figure 3:
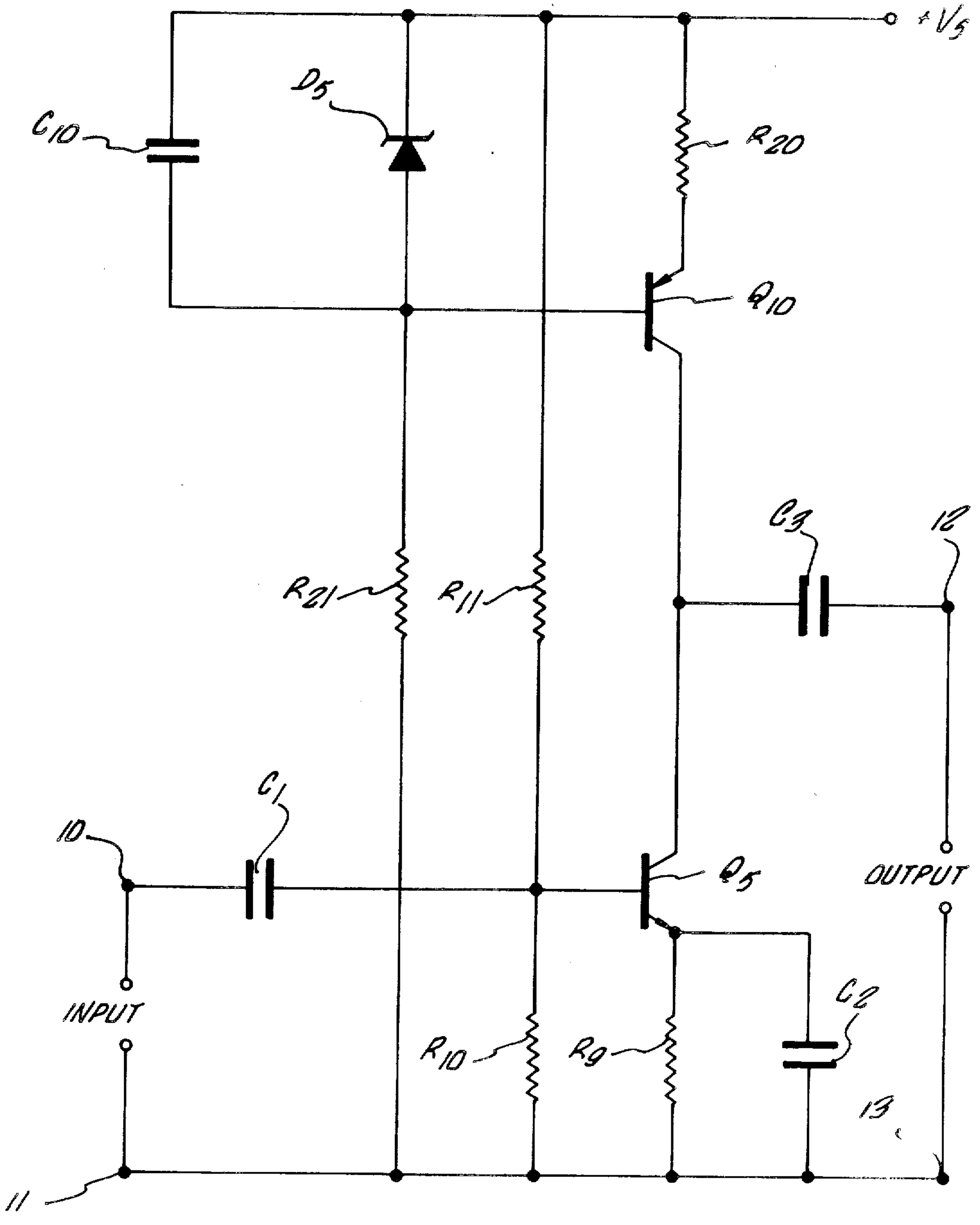
FIG. 3 is a schematic diagram of a third embodiment of an amplifier constructed in accordance with the principles of the present invention.

Referring now to FIG. 3, there is shown a third embodiment of a transistor amplifier constructed in accordance with the principles of the present invention.

Shown in FIG. 3 is an amplifier having a DC bias circuit similar to that of the embodiments of FIGS. 1 and 2. The collector load for the output transistor $Q_5$ of FIG. 3 is provided by a transistor $Q_{10}$. A zener diode $D_6$ in series with a resistor $R_{21}$ is connected between the supply voltage and a second reference potential, as shown.

A zener diode $D_5$, as shown, provides the base bias voltage for collector load transistor $Q_{10}$. An emitter bias resistor $R_{20}$ is connected between the emitter of the transistor $Q_{10}$ and the voltage supply $V_r$. The value of bias resistor $R_{20}$ is chosen in a manner as previously described to enable collector load transistor $Q_{10}$ to provide the required supply current to the collector terminal of output transistor $Q_5$.

The operation of the embodiment of FIG. 3 is similar to that of the embodiments of FIGS. 1 and 2 and need not be repeated here. It should be noted that the embodiment of FIG. 3 does not require the resistor $R_{21}$ and diode $D_6$ to be in parallel electrical connection with the output transistor collector load circuit. Neither does the embodiment of FIG. 3 require the use of battery cells, As in the embodiments of FIGS. 1 and 2, the voltage gain of the amplifier circuit of FIG. 3 may be made to approach the maximum theoretical gain of the output transistor $Q_5$. The amplifier of FIG. 3 may be operated with any supply voltage below the breakdown level of transistor $Q_{10}$.

There has therefore been described unique amplifying circuits capable of providing voltage gains in excess of any single stage transistor amplifier voltage gain achievable by the prior art.

What is claimed is:

1. In a transistor amplifier circuit including an output amplifying transistor and a source of supply voltage, a collector load for said output amplifying transistor comprising:

a plurality of cascade connected load transistors having their collector-emitter terminals in series electrical configuration, said series electrical configuration being connected between the source of supply voltage and the collector terminal of said output amplifying transistor:

switch means for energizing and deenergizing said amplifier circuit; and bias means fixedly biasing the base electrodes of said plurality of load transistors whereby said plurality of load transistors supplies a constant current to the collector terminal of said output amplifying transistor, said bias means including:

a plurality of bias cells, one each connected between the base and emitter terminals of each of said plurality of load transistors, choke means connected in series electrical configuration with said bias cells to isolate said base terminal from AC signal components and means responsive to the deenergizing of said amplifier circuit to disconnect said bias cells whereby no power will be drawn from said cells when said amplifying circuit is deenergized.

2. A high gain, high output voltage amplifier circuit comprising:

an amplifying stage including a first transistor having a base electrode, a collector electrode and an emitter electrode;

an input terminal connected to said base electrode adapted to apply input signals to said amplifying stage;

an output terminal connected to said collector electrode adapted to provide output signals from said amplifying stage;

a source of DC voltage;

a constant current source, connected between said source and said collector electrode for providing a predetermined constant amount of current to said first transistor, said constant current source including a plurality of serially connected load transistor circuits each including a second transistor having a base electrode, collector electrode and an emitter electrode, a Zener diode connected to the base electrode of said second transistor for fixing the voltage at which said base electrode is biased, and a capacitor connected in parallel with said Zener diode for immunizing said Zener diode from the effects of AC input signals.